(12) United States Patent
Shi et al.

(10) Patent No.: US 7,432,592 B2
(45) Date of Patent: Oct. 7, 2008

(54) INTEGRATED MICRO-CHANNELS FOR 3D THROUGH SILICON ARCHITECTURES

(75) Inventors: Wei Shi, Gilbert, AZ (US); Daoqiang Lu, Chandler, AZ (US); Yiqun Bai, Chandler, AZ (US); Qing A. Zhou, Chandler, AZ (US); Jiangqi He, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/250,644

(22) Filed: Oct. 13, 2005

(65) Prior Publication Data

US 2007/0085198 A1     Apr. 19, 2007

(51) Int. Cl.
*H01L 23/34*     (2006.01)

(52) U.S. Cl. ............... 257/714; 257/721; 257/E23.098

(58) Field of Classification Search ............... 257/685, 257/713, 714
See application file for complete search history.

(56) References Cited

U.S. PATENT DOCUMENTS

| | | | |
|---|---|---|---|
| 5,199,165 A * | 4/1993 | Crawford et al. ............... 29/846 |
| 6,678,168 B2 * | 1/2004 | Kenny et al. ................. 361/764 |
| 6,717,251 B2 * | 4/2004 | Matsuo et al. ............... 257/686 |
| 2004/0196634 A1 * | 10/2004 | Mallik et al. ................. 361/704 |
| 2005/0139992 A1 * | 6/2005 | Holalkere et al. ........... 257/706 |
| 2005/0211418 A1 * | 9/2005 | Kenny et al. ............... 165/80.4 |

* cited by examiner

*Primary Examiner*—Leonardo Andujar
*Assistant Examiner*—Krista Soderholm
(74) *Attorney, Agent, or Firm*—David L. Guglielmi

(57) ABSTRACT

Some embodiments of the present invention include apparatuses and methods relating to integrated micro-channels for removing heat from 3D through silicon architectures.

9 Claims, 4 Drawing Sheets

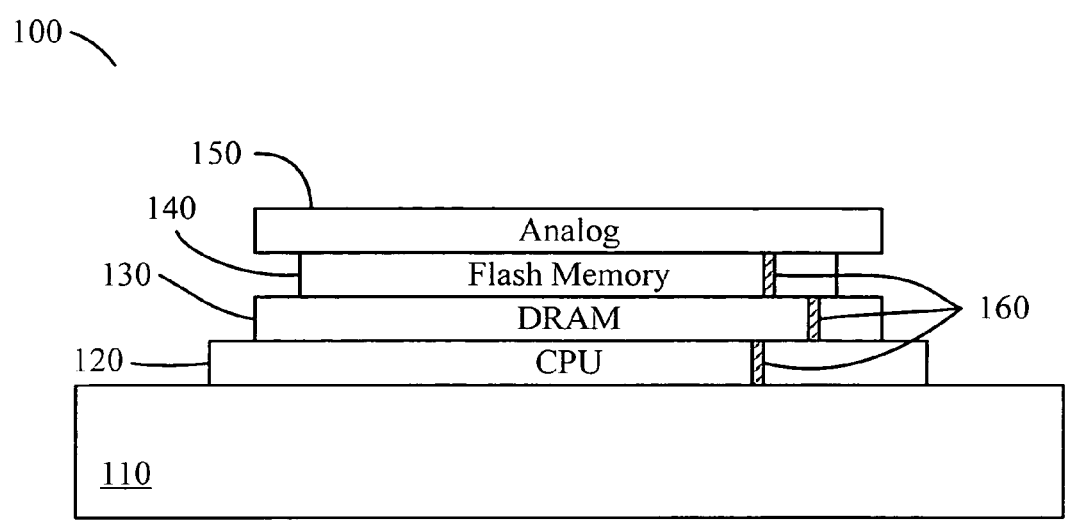
FIG. 1 – PRIOR ART

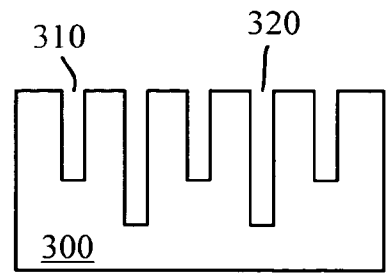
FIG. 3A    FIG. 3B
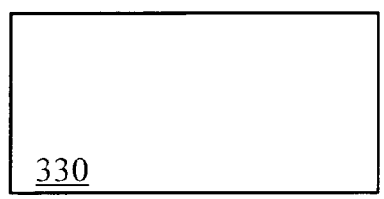
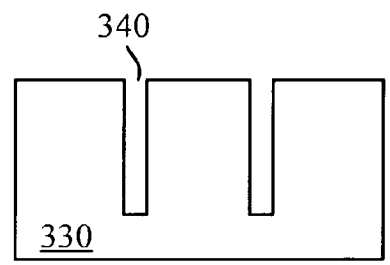
FIG. 3C    FIG. 3D
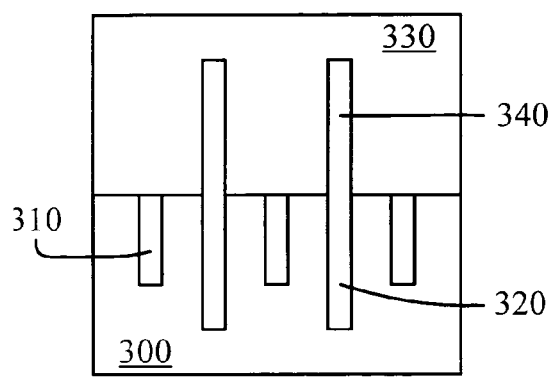
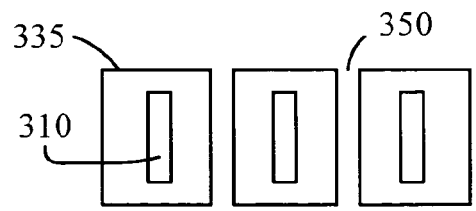
FIG. 3E    FIG. 3F

INTEGRATED MICRO-CHANNELS FOR 3D THROUGH SILICON ARCHITECTURES

TECHNICAL FIELD

Embodiments of the invention relate to microelectronics packaging. In particular, embodiments of the invention relate to heat removal in 3D through silicon architectures.

BACKGROUND

In microelectronics packaging, there is a continuing effort to produce smaller and faster electronics. 3D packaging architectures, including stacked die architectures, may offer several advantages (such as smaller size and reduced interconnect distances) over 2D packaging architectures.

Typical 2D packaging architectures may include a die flip-chip connected to a substrate, such that the active surface (including devices and metal layers) of the die faces the substrate. A cooling solution may then be provided on the exposed backside of the die. The cooling solution may include a heat sink, an integrated heat spreader, or a fan, for example.

FIG. 1 illustrates a typical 3D package 100 including a substrate 110, a central processing unit (CPU) die 120, dynamic random access memory (DRAM) die 130, a flash memory die 140, and an analog die 150. Substrate 110 may typically include a printed circuit board or motherboard. For 3D package 100 to function, the active surface of each component must be electrically connected to substrate 110 or the active surface of an adjacent component. To interconnect the active surfaces, conductive through silicon vias (TSV) 160 may be extended through the components.

For example, CPU die 120 may be flip-chip connected to substrate 110 such that the active surface of CPU die 120 faces substrate 110. DRAM die 130 may be connected to CPU die 120 with bump soldering such that the active surface of DRAM die 130 faces the inactive surface of CPU die 120. The TSV of CPU die 120 may then electrically connect the active surface of DRAM die 130 to the active surface of CPU die 120 or to substrate 110.

In a similar manner, the active surfaces of each component may be electrically interconnected.

BRIEF DESCRIPTION OF THE DRAWINGS

The invention is illustrated by way of example and not by way of limitation in the figures of the accompanying drawings, in which the like references indicate similar elements and in which:

FIG. 1 illustrates a prior art apparatus.

FIGS. 3A-3I illustrate a method for forming a cooling solution having a micro-channel and a through via.

DETAILED DESCRIPTION

In various embodiments, apparatuses and methods relating to 3D wafer or die packaging architectures are described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

To produce smaller and faster electronics, the packaging density of semiconductor chips (or dies) may be increased. One solution for increasing packaging density may include 3D packaging architectures, such as chip stacking. In operation, the active region or areas of the chips in the stack may generate heat. To increase the performance of the chips, to use chips with increased performance capability, or to implement high power packages, the generated heat may be removed. Typical 3D packaging architectures may not offer any heat removal or thermal solutions.

Typically, in single chip packaging, a back side cooling solution, such as an integrated heat spreader or a fan, may be used to remove the heat. However, in stacked chip arrangements it may not be practicable to use backside cooling solutions because the backsides of some chips may not be exposed, due to space constraints, or because of incompatibility with electrical connection routing. Briefly, embodiments of the present invention may provide a cooling solution for stacked chips that includes vias for electrical routing between the chips.

Figure 2A:
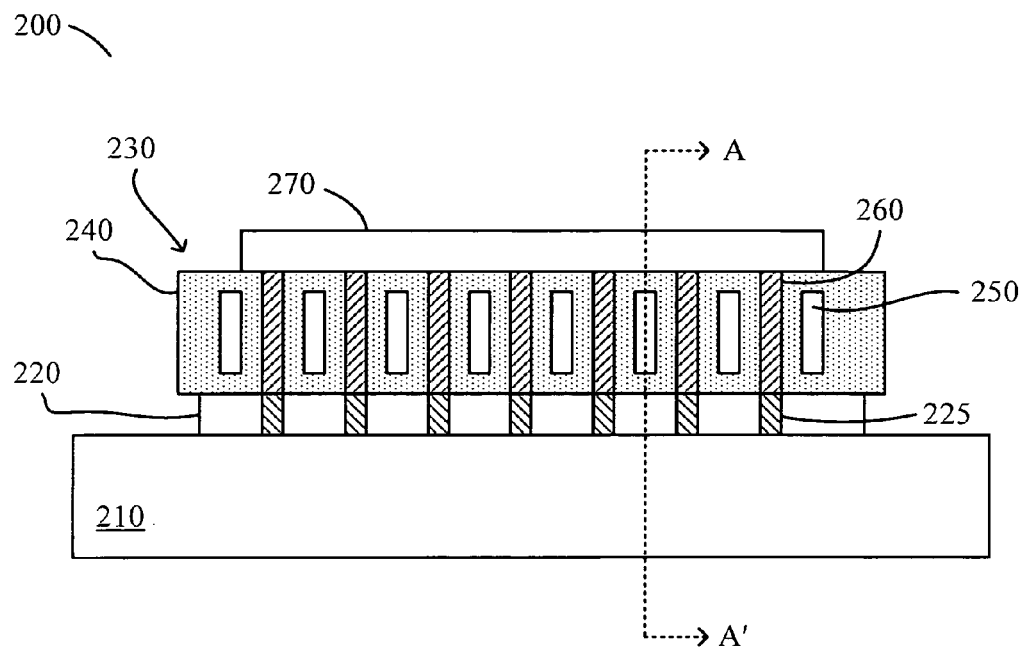
FIGS. 2A-2B illustrate cross sectional type side views a die attached to a substrate, a cooling solution attached to the die, and a second die attached to the cooling solution.
Figure 2B:
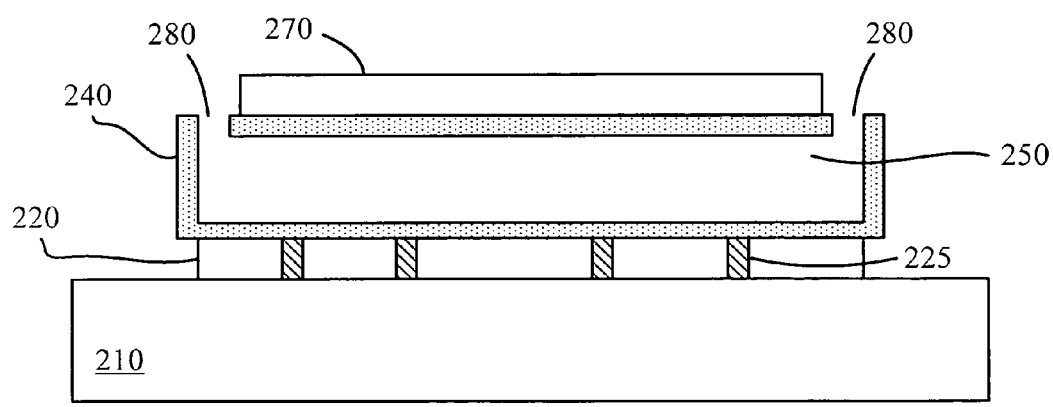

FIGS. 2A and 2B illustrate cross sectional views of an apparatus 200 that may provide heat removal for stacked dies according to the invention. FIG. 2B shows a view taken along segment A-A' of FIG. 2A.

Apparatus 200 includes a substrate 210, a die 220, a cooling solution 230, and a die 270. Cooling solution 230 includes a substrate 240, though vias 260, and a micro-channel 250. Die 220 may include through vias 225.

Substrate 210 may include any suitable substrate for mounting die 220. In various embodiments, substrate 210 may include a printed circuit board (PCB), a motherboard, or an interposer. Substrate 210 may include conductive traces and conductive pads or bumps to facilitate the mounting of die 220. Die 220 may be mounted to substrate 210 by any suitable technique. In an embodiment, die 220 may be flip-chip connected to substrate 210 by solder bumps, copper bumps, conductive landing pads, or the like, such that an active surface of die 220 faces substrate 210. In an embodiment, though vias 225 may provide electrical routing through die 220. In an embodiment, through vias 225 may include copper.

Cooling solution 230 and die 220 may be connected by any suitable technique. In an embodiment, cooling solution 230 and die 220 may be connected by a diffusion bond. In an embodiment, cooling solution 230 and die 220 may both comprise silicon and they may be connected by a silicon to silicon diffusion bond. In other embodiments, cooling solution 230 may be attached to die 220 by bump soldering techniques including bumps or landing pads. In various embodiments, cooling solution 230 may be bigger than, the same size as, or smaller than die 220.

Die 270 and cooling solution 230 may be connected by any suitable through silicon via technique. In an embodiment, cooling solution 230 and die 270 may be connected by a diffusion bond. In an embodiment, cooling solution 230 and die 270 may both comprise silicon and they may be connected by a silicon to silicon diffusion bond. In other embodiments, cooling solution 230 may be attached to die 270 by bump soldering techniques including bumps or landing pads. In various embodiments, the active surface of die 270 may face cooling solution 230 or the active surface of die 270 may face away from cooling solution 230. In an embodiment, die 270 may include conductive through vias (not shown) to provide electrical routing through die 270. In an embodiment, cooling solution 230 may include bond pads or bumps to facilitate connection to die 270.

Die 220 and die 270 may include any suitable dies, integrated circuits, or chips. For example, die 220 and die 270 may include central processing units (CPU), random dynamic access memory (DRAM), analog devices, or Flash memory dies in any combination. In an embodiment, die 220 and die 270 may both include CPUs. In another embodiment, die 220 may include a CPU and die 270 may include a DRAM die. In an embodiment, die 220 may include a thinned die. In another embodiment, die 270 may include a thinned die.

Further, any number of additional dies or cooling solutions analogous to cooling solution 230 may be stacked above die 270 in any arrangement. The dies stacked above die 270 may include CPUs, DRAM, analog devices, or Flash memory in any combination. In an embodiment, die 220 may include a CPU, die 270 may include DRAM, and a Flash memory and analog device may be stacked above die 270. In another embodiment, die 220 and die 270 may include CPUs and a stack including a cooling solution, and a DRAM die may be stacked above die 270.

As discussed, cooling solution 230 includes substrate 240, micro-channel 250, and through vias 260. Through vias 260 may extend across substrate 240 to provide conductive routing. In an embodiment, through vias 260 may provide minimal length or direct electrical routing between die 220 and die 270. Through vias 260 may include any suitable conductive material or combination of such materials. In an embodiment, through vias 260 may include copper. Substrate 240 may include any suitable material. In an embodiment, substrate 240 may include silicon and through vias 260 may be though silicon vias (TSV).

Micro-channel 250 may provide a substantially enclosed region within substrate 240 for a coolant (not shown). In an embodiment, the coolant may flow though micro-channel 250 to remove heat from die 220 and die 270. In an embodiment, a single micro-channel may be provided. The single micro-channel may extend substantially throughout substrate 240. In other embodiments, any number of discrete micro-channels may be provided. In an embodiment, micro-channel 250 may be designed to correspond to the heat removal needs of die 220, die 270, or both. In an embodiment, micro-channel 250 may provide more micro-channels or channel area by regions of die 220 or die 270 that require greater heat removal, such as hot spots.

As shown in FIG. 2B, input/outputs 280 may be provided along with micro-channel 250. Any number of input/outputs may be provided as needed. For example, if a single micro-channel is used, a single or multiple input/output may be used. If multiple discrete micro-channels are used, at least one input/output may be provided for each micro-channel.

The coolant may include any suitable material that may remove heat. In an embodiment, the coolant may include a liquid. In an embodiment, the coolant may include a two phase flow coolant. In an embodiment, the coolant may flow between cooling solution 230 and one or more external heat exchangers that may cool or condense the coolant.

FIGS. 3A-3H illustrate a method that may provide a cooling solution according to the invention.

FIG. 3A illustrates a starting substrate 300. Substrate 300 may include any suitable material. In an embodiment, substrate 300 may include silicon. In an embodiment, substrate 300 may be a wafer. In another embodiment, substrate 300 may be a part of a wafer or a chip.

As illustrated in FIG. 3B, openings 310 and openings 320 may be formed in substrate 300. In an embodiment, openings 310 may subsequently form micro-channels and openings 320 may subsequently form through vias, as is further discussed below.

Openings 310 may be any suitable width. In an embodiment, openings 310 may have a width in the range of about 5 to 10 microns. In another embodiment, openings 310 may have a width in the range of about 6 to 8 microns. In an embodiment, openings 310 may have a width in the range of about 7 to 10 microns. Openings 310 may also have any suitable depth so long as they are shallower than openings 320. Therefore, openings 310 may be considered shallow openings and openings 320 may be considered deep openings. In an embodiment, openings 310 may have a depth in the range of about 50 to 100 microns. In another embodiment, openings 310 may have a depth in the range of about 60 to 80 microns. In an embodiment, openings 310 may have a depth in the range of about 75 to 100 microns.

Openings 310 may form a pattern that provides for a micro-channel that substantially extends or runs throughout substrate 300 or a portion of substrate 300. For example, if substrate 300 is a chip or die, openings 310 may form a pattern that substantially extends throughout substrate 300. In another embodiment, if substrate 300 is a wafer, openings 310 may form patterns for several micro-channel layouts that each correspond to a die, such that the wafer may be aligned to a wafer (FIG. 3G) of integrated circuits to provide a micro-channel layout for each integrated circuit. In another embodiment, openings 310 may form a pattern that provides for multiple discrete micro-channels for a chip or die.

Openings 320 may be of any dimensions and may correspond to a desired pattern of through vias for a 3D architecture. In an embodiment, openings 320 may have a generally round or oval shape when viewed from the top-down. Openings 320 may have any depth. In an embodiment, openings 320 may be in the range of about 100 to 150 micron deep. In another embodiment, openings 320 may be in the range of about 80 to 120 micron deep. In an embodiment, openings 320 may be in the range of about 50 to 100 micron deep.

In an embodiment, openings 320 may have a depth greater than the depth of openings 310. In an embodiment, openings 320 may be deeper than openings 310 by about 5 to 10 microns. In another embodiment, openings 320 may be deeper than openings 310 by about 2 to 8 microns. In an embodiment, openings 320 may be deeper than openings 310 by about 10 to 20 microns. In another embodiment, openings 320 may extend through substrate 300.

Openings 310 and openings 320 may be formed by any suitable technique. In an embodiment, they may be formed by two photolithography and etch steps. In an embodiment, openings 310 and openings 320 may be formed by: forming a resist pattern on substrate 300, etching exposed portions of substrate 300 to form either openings 310 or openings 320, removing the first resist pattern, forming a second resist pattern on substrate 310, etching exposed portions of substrate 300 to form the remaining openings, and removing the second resist pattern.

FIG. 3C illustrates a second starting substrate 330. Substrate 330 may include any suitable material. In an embodiment, substrate 330 may include silicon. In an embodiment, substrate 330 may be a wafer. In another embodiment, substrate 330 may be a part of a wafer or a chip.

As illustrated in FIG. 3D, openings 340 may be formed in substrate 330. In an embodiment, some of openings 340 may subsequently form a portion of through vias. In an embodiment, some of openings 340 may subsequently form input/outputs for a micro-channel.

Openings 340 may be of any suitable depth and width. In an embodiment, openings 340 may have a pattern that corresponds to the pattern and dimensions of openings 320. Openings 340 may be formed by any suitable technique. In an embodiment, they may be formed by photolithography and etch. In an embodiment, openings 340 may be formed by: forming a resist pattern on substrate 330, etching exposed portions of substrate 330 to form either openings 340, and removing the resist pattern. In an embodiment, openings 340 may extend though substrate 330.

As illustrated in FIG. 3E, substrates 300 and 330 may be aligned and bonded. Substrates 300 and 330 may be aligned and bonded by any suitable techniques. In an embodiment, substrates 300 and 330 may be aligned such that openings 320 and 340 are substantially aligned. In an embodiment, a number of openings 340 may align with openings 310 such that inputs and outputs for a micro-channel may be formed (such alignments are not shown in FIG. 3E for the sake of clarity). In an embodiment, substrates 300 and 330 may be bonded by diffusion bonding. In another embodiment, substrate 300 and 330 may include silicon and they may be bonded by silicon to silicon diffusion bonding. In other embodiments, substrates 300 and 330 may be bonded using an adhesive or epoxy.

As illustrated in FIG. 3F, substrates 300 and 330 may be thinned to form an apparatus 335. At the illustrated cross-section, it appears that the substrate has been separated; however, the substrate may remain continuous as may be shown at other available cross-sections. FIG. 3F also illustrates the formation of through vias 350. In FIG. 3F any seam between substrates 300 and 330 is not illustrated for the sake of clarity. Substrates 300 and 330 may be thinned by any suitable technique, such as a back side grind technique.

In the illustrated embodiment, bonding is shown before thinning. However, thinning, if any, may be performed prior to bonding. In an embodiment, substrate 300 may be thinned before bonding. In another embodiment, substrate 330 may be thinned before bonding. In an embodiment, both substrate 300 and substrate 330 may be thinned prior to bonding. In another embodiment, thinning of either substrate or both substrates may not be required.

Figure 3G:
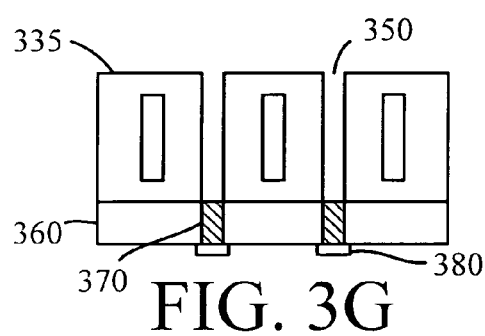

As illustrated in FIG. 3G, apparatus 335 may be aligned and bonded to a substrate 360. Substrate 360 may include though vias 370 and bumps 380. In an embodiment, substrate 360 may include a chip or die. In an embodiment, substrate 360 may include an integrated circuit. In some embodiments, substrate 360 may include a CPU, DRAM, analog device, or Flash memory device. In another embodiment, substrate 360 may include a wafer of integrated circuits. In another embodiment, apparatus 335 may be aligned to substrate 360 such that some of through vias 350 align with some of through vias 370. In various embodiments, an active surface of substrate 360 may face apparatus 335 or the active surface may face away from apparatus 335.

Figure 3H:
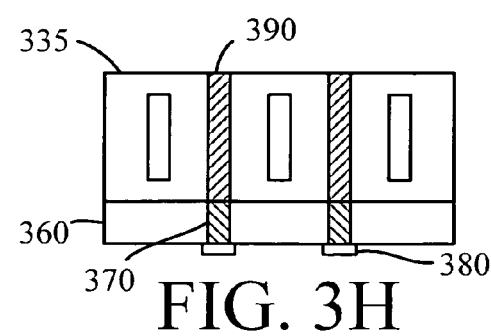

As illustrated in FIG. 3H, conductive through vias 390 may be formed. Conductive through vias 390 may include any suitable conductive material. In an embodiment, conductive through vias 390 may include copper. Conductive through vias 390 may be formed by any suitable technique, such as sputtering, chemical or physical vapor deposition, electro plating, electroless plating, or others.

As illustrated, apparatus 335 may be bonded to a substrate and conductive through vias may be formed. In other embodiments, apparatus 335 may not be bonded to a substrate prior to forming conductive through vias 390. In an embodiment, conductive through vias 390 may be formed in apparatus 335 (FIG. 3F) to form an apparatus having a micro-channel and conductive through vias. The apparatus formed in that manner may be attached to a die or dies by any suitable technique, such as diffusion bonding or bump soldering bonding.

Figure 3I:
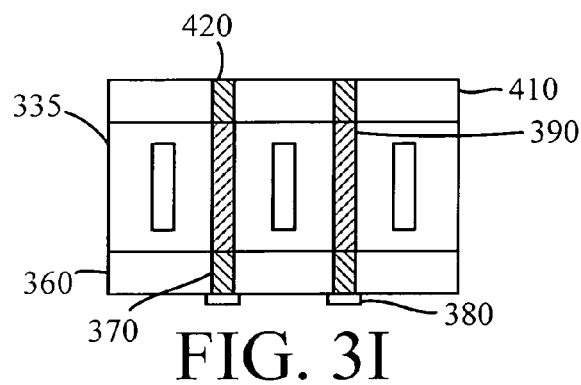

As illustrated in FIG. 3I, apparatus 335 may be aligned and bonded to a substrate 410. Substrate 410 may include though vias 420. In an embodiment, substrate 410 may include a chip or die. In an embodiment, substrate 410 may include an integrated circuit. In some embodiments, substrate 410 may include a CPU, DRAM, analog device, or Flash memory device. In another embodiment, substrate 410 may include a wafer of integrated circuits. In another embodiment, apparatus 335 may be aligned to substrate 400 such that some of through vias 420 align with some of through vias 370. In an embodiment, substrate 410 may be bonded by diffusion bonding. In an embodiment, substrate 410 may be attached by bump soldering bonding. In an embodiment, bumps may be formed on substrate 410, apparatus 330, or both to facilitate bonding. In various embodiments, an active surface of substrate 410 may face apparatus 335 or the active surface may face away from apparatus 335.

If the above technique is used with wafers having discrete integrated circuit components and micro-channel cooling solutions, the embodiments of FIG. 3H or FIG. 3I may be diced to form individual die and cooling solution components.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. An apparatus comprising:
   an integrated circuit die including a through via; and
   a substrate attached to the integrated circuit die, wherein the substrate includes a second through via and a substantially enclosed micro-channel to remove heat from the integrated circuit die, wherein the substrate comprises a first portion with a first opening and a second portion with a second opening, and wherein the micro-channel is formed by aligning the first opening with the second opening wherein the substrate is opposite an active surface of the integrated circuit die.

2. The apparatus of claim 1, wherein the integrated circuit die and the substrate are bonded by a silicon to silicon bond.

3. The apparatus of claim 1, further comprising:
   a second substrate electrically connected to the active surface of the integrated circuit die.

4. The apparatus of claim 3, wherein the second substrate comprises a printed circuit board.

5. The apparatus of claim 1, further comprising:
   a second integrated circuit die attached to the substrate.

6. The apparatus of claim 5, wherein the second integrated circuit die is bump soldering bonded to the substrate.

7. The apparatus of claim 5, wherein the integrated circuit die comprises a central processing unit and the second integrated circuit die comprises a second central processing unit.

8. The apparatus of claim 5, wherein the integrated circuit die comprises a central processing unit and the second integrated circuit die comprises dynamic random access memory.

9. The apparatus of claim 8, further comprising a flash memory component attached to the second integrated circuit die, wherein the second integrated circuit die includes a third through via.

* * * * *